US010635776B1

(12) United States Patent
Yan

(10) Patent No.: US 10,635,776 B1
(45) Date of Patent: Apr. 28, 2020

(54) PRODUCING MASK LAYOUTS WITH ROUNDED CORNERS

(71) Applicant: Synopsys, Inc., Mountain View, CA (US)

(72) Inventor: Qiliang Yan, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/034,292

(22) Filed: Jul. 12, 2018

Related U.S. Application Data

(60) Provisional application No. 62/532,407, filed on Jul. 14, 2017.

(51) Int. Cl.
G06F 17/50 (2006.01)
G03F 1/68 (2012.01)
G03F 1/36 (2012.01)

(52) U.S. Cl.
CPC .......... *G06F 17/5081* (2013.01); *G03F 1/36* (2013.01); *G03F 1/68* (2013.01)

(58) Field of Classification Search
CPC .......... G06F 17/5077; G06F 17/5036; G06F 17/5045; G06F 17/5081; G06F 2217/12; G06F 17/50; G06F 17/5068; G06F 17/509; H01L 23/528; H01L 27/0207; G03F 7/705; G03F 1/36; G03F 7/70283; G03F 7/70625; G03F 7/70666; G03F 7/70433; G03F 7/70441; G03F 7/70633; G03F 7/70675; G03F 1/84; G03F 9/7092; G06T 2207/30148; G06T 7/0006; G06T 2207/20076; G06T 7/33
USPC ...................................... 716/50–56
See application file for complete search history.

(56) References Cited

U.S. PATENT DOCUMENTS

| 7,355,681 | B2 | 4/2008 | Laiding et al. | |
|---|---|---|---|---|
| 7,600,212 | B2 | 10/2009 | Zach et al. | |
| 2003/0233630 | A1* | 12/2003 | Sandstrom | G03F 7/70291 716/50 |
| 2014/0317580 | A1* | 10/2014 | Ye | G03F 1/144 716/53 |
| 2015/0089459 | A1* | 3/2015 | Liu | G03F 7/705 716/53 |

* cited by examiner

Primary Examiner — Binh C Tat
(74) Attorney, Agent, or Firm — Fenwick & West LLP

(57) ABSTRACT

A two-dimensional representation of a polygon is converted to a parametric representation. A smoothing filter is applied to the parametric representation to produce corner rounding. In some embodiments, a polygon layout plus a model that specifies how much corner rounding should be applied are taken as inputs. The desired amount of rounding to the corners in the input polygons is applied and this produces a new polygon layout with corners that are properly rounded as its output. The process can be implemented so that it does not induce any pattern-size dependent bias. It also can be designed so that it does not induce line-end pullbacks. However, this feature can be turned off if line-end pullbacks are deemed appropriate for the specific application.

19 Claims, 9 Drawing Sheets

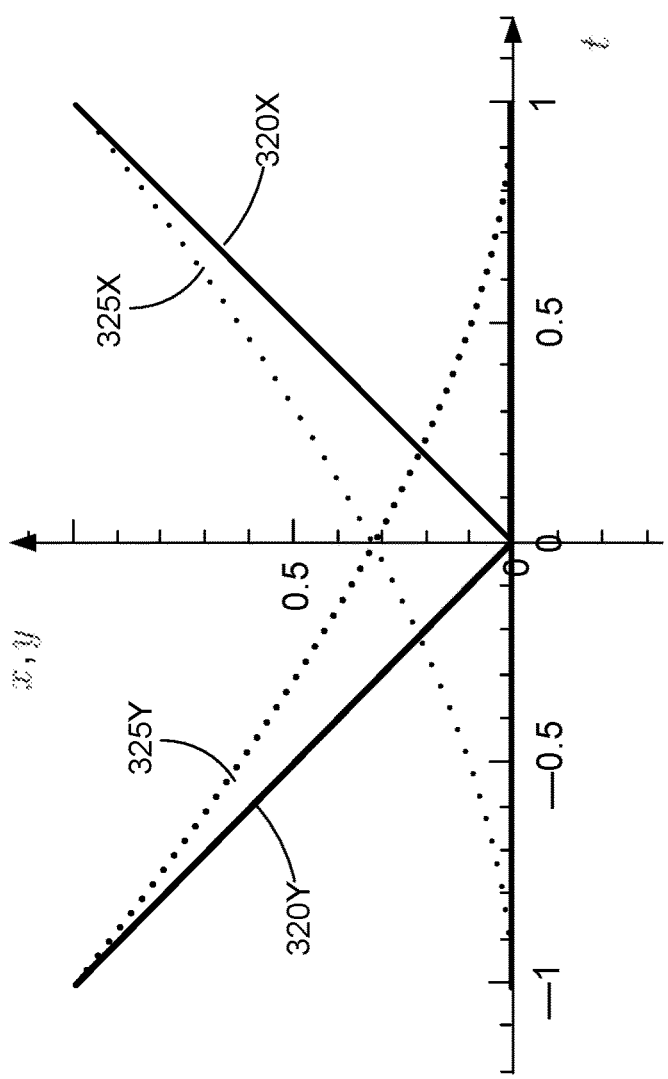
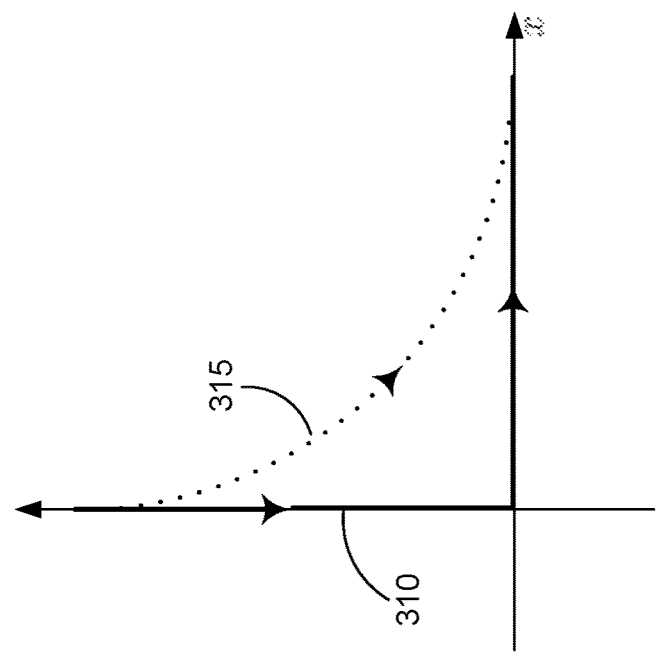
FIG. 3B
FIG. 3A

PRODUCING MASK LAYOUTS WITH ROUNDED CORNERS

CROSS-REFERENCE TO RELATED APPLICATION(S)

This application claims priority under 35 U.S.C. § 119(e) to U.S. Provisional Patent Application Ser. No. 62/532,407, "Flexible Configurable Method to Produce Polygon Layout with Rounded Corners," filed Jul. 14, 2017. The subject matter of all of the foregoing is incorporated herein by reference in their entirety.

BACKGROUND

1. Technical Field

This disclosure relates generally to corner rounding effects in lithographic masks.

2. Description of Related Art

In lithography process, mask shops use e-beam writer and other process steps to make a lithographic mask. A design process is used to come up with a design layout for a lithographic mask. The design process may make use of techniques such as OPC (optical proximity correction) and ILT (inverse lithography technology). This design layout is used to produce the lithographic mask. However, the final actual shapes on the physical mask may differ slightly from the post-OPC/ILT design layout. Particularly, sharp corners in the polygon layout often become rounded in the actual final mask. This corner rounding effect, commonly known as "Mask Corner Rounding" or MCR, is often considered in OPC models.

Certain steps in the mask writing process, particularly etching, can produce different amount of rounding for outer (convex) corners and inner (concave) corners. The rounding radius may also change due to other factors, e.g., local pattern density. A good MCR model should be flexible enough to account for such variations in corner radius.

The forward and backward scattering of e-beams can also cause pattern-size dependent mask bias and/or line-end pullbacks. If these effects are already corrected in the mask writing process by "Mask Error Correction," then they should not appear in an MCR model. Otherwise, these effects are double counted.

The lithography simulation for OPC and ILT must be fast enough so that the process can be finished in a reasonable turnaround time. Mask corner rounding, however, inevitably increases the number of polygon vertices, thereby increasing the simulation run time. A good MCR model should also provide a mechanism such that a tradeoff between model accuracy and run time can be made.

When OPC or ILT optimizes the mask layout, it continuously changes the polygon size to minimize certain cost function. Many optimization algorithms require the cost function to be continuous. Therefore, a good corner rounding solution should also be a continuous function of the input polygon layout.

Historically, several different approaches have been used to model mask corner rounding. One class of approaches is based on Boolean operations. For example, a bevel( ) command cuts out or adds a triangular corner of given size from each right angle corner of the mask. As another example, a corner_cut( ) command cuts out or adds a small square of given size from each right angle corner of the mask. Some limitations of these approaches are that they can only handle Manhattan polygons and that they cannot properly handle jogs and small corners. In fact, if two or more corners are too close to each other, these two commands may fail. They may simply give up and leave the corner intact. Such an approach can be a serious limitation. It can cause difficulties during OPC, in which the corner size changes continuously. When the corner size moves across the critical corner size, the corner cutting is suddenly turned on or off, causing discontinuities in the OPC merit function, which can in turn prevent OPC from converging.

Another approach uses an IMO (Integrated Mask and Optics) model. With an IMO model, a modeler can provide a two-dimensional convolution kernel that resembles the point spread function of the e-beam mask process and a threshold value. The user does not directly specify the radius of rounded corners. Instead, the amount of rounding is implicitly determined by the point spread function and the threshold. It is not very straightforward to specify inner and outer radii separately. During model simulation, an implicit rounded mask contour is generated and applied during the mask rasterization step. The mask contour is implicit because the system does not store the rounded mask contour as a new layout. Users may have no way to examine the mask contour. This implicit contour is not compatible with later modeling that requires an explicit mask layout as an input. Also note that since this is an e-beam model, pinching and bridging can happen when the mask feature is small, or when two features are close to each other. As mentioned earlier, such behavior is usually undesired, as it should have been addressed in mask error corrections. Other disadvantages of IMO include larger shift variation and relatively slow run time performance.

In yet another approach, the user can directly specify the inner and outer radii of the rounded mask. An underlying e-beam model and a threshold are used to produce the mask contour. During the simulation, an explicit rounded mask contour is generated and fed into an all-angle mask rasterization and to 3D mask model ripple painting routines. Since it uses an e-beam model, the generated mask contour again could suffer from pinching and bridging. However, MCR models can be significantly slower than non-MCR models, due to the increased number of vertices in the rounded mask contour.

Thus, there is a need for better approaches to estimate corner rounding in lithographic masks.

SUMMARY

The present disclosure overcomes the limitations of the prior art by converting a two-dimensional representation of a polygon to a parametric representation and then applying a smoothing filter to the parametric representation to produce the corner rounding.

In some embodiments, a polygon layout plus a model that specifies the amount of corner rounding are taken as inputs. The desired amount of rounding to the corners in the input polygons is applied and this produces a new polygon layout with corners that are properly rounded as its output. The process can be implemented so that it does not induce any pattern-size dependent bias. It also can be designed so that it does not induce line-end pullbacks. However, this feature can be turned off if line-end pullbacks are deemed appropriate for the specific application.

In some versions, different radii for the corner rounding may be applied to different corners. In one embodiment, the radii are defined by two numbers: the inner radius to be applied to concave corners and the outer radius to be applied to convex corners. In another embodiment, the radius is specified by a general model, which calculates the amount of corner rounding from the coordinates of the three consecutive vertices that form the corner. In yet another embodiment, the amount of corner rounding for each corner is pre-computed offline and stored as a lookup table. The lookup table is consulted at run-time to apply corner rounding to input polygons.

Some versions allow the user to control how smooth the rounded corners should be, by specifying the desired number of line segments used to represent each rounded corner. This provides a way for the user to make trade-offs between model accuracy and run time.

This approach preferably results in an output that is continuous with respect to the input polygons. No abrupt changes in output occur as the input polygons are continuously changed during OPC or ILT, thus facilitating convergence of optimizations during OPC or ILT.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

FIG. 3A shows an isolated square corner and the corresponding rounded corner.

FIG. 3B shows a parametric representation of the square corner and rounded corner of FIG. 3A.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1A:
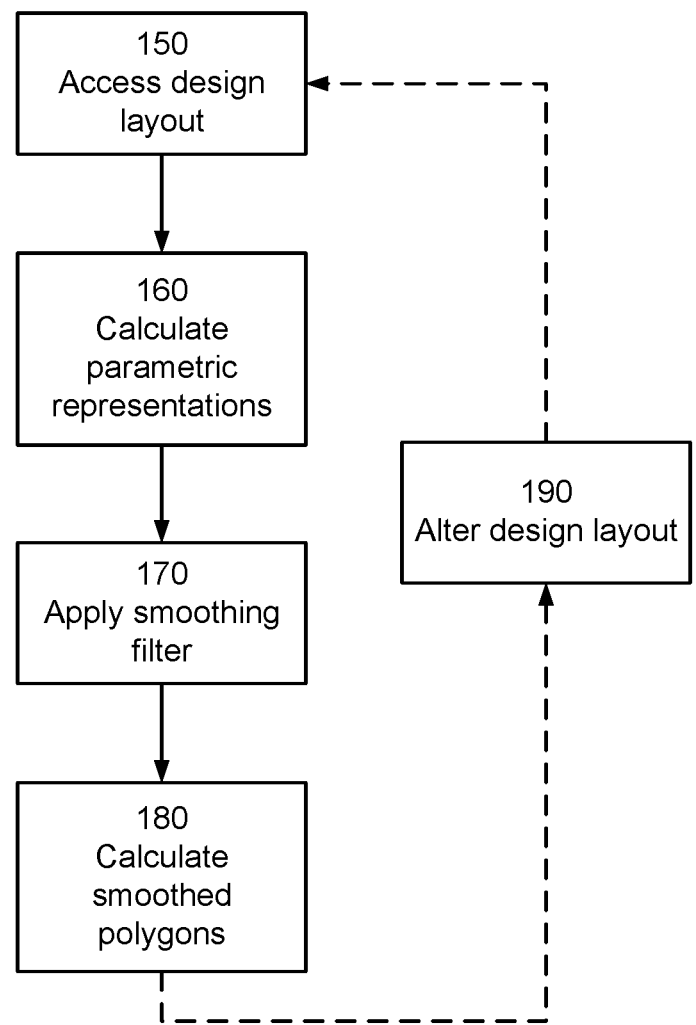
FIG. 1A is a flow diagram of a method for estimating corner rounding in lithographic masks, according to the invention.

FIG. 1A is a flow diagram of a method for modeling corner rounding in lithographic masks. This approach is based on using parametric representations of the polygons in the design layout of the mask, and then applying a smoothing filter to the parametric representations. In FIG. 1A, a design layout of a lithographic mask is accessed 150. It may be contained in a design database for an integrated circuit design, for example. The design layout includes many polygons that are described by two-dimensional representations in (x,y). In a common approach, each polygon is described by a list of the (x,y) coordinates of its vertices. Parametric representations $\gamma(t)=(x(t), y(t))$ of the two-dimensional representations of the polygons are calculated 160. In the following examples, the parametric representations are a function of the parameter t. A smoothing filter f(t) is applied 170 to the parametric representations $\gamma(t)$ to produce smoothed parametric representations $\tilde{\gamma}(t)$. These are used to calculate 180 smoothed two-dimensional representations of the polygons. For example, the smoothed parametric representations $\tilde{\gamma}(t)$ may be sampled at different values of the parameter t. The smoothing filter f(t) is designed so that the resulting smoothed two-dimensional representations have rounded corners on the polygons. The rounded corners may be the result of various effects in the e-beam writing or other process steps. Steps 160-180 may be used to simulate these effects. The resulting MCR model may be used for various applications, such as lithography rules checking. Optionally, the original design layout before corner rounding may be optimized or otherwise altered 190, taking into account the corner rounding effects.

Figure 1B:
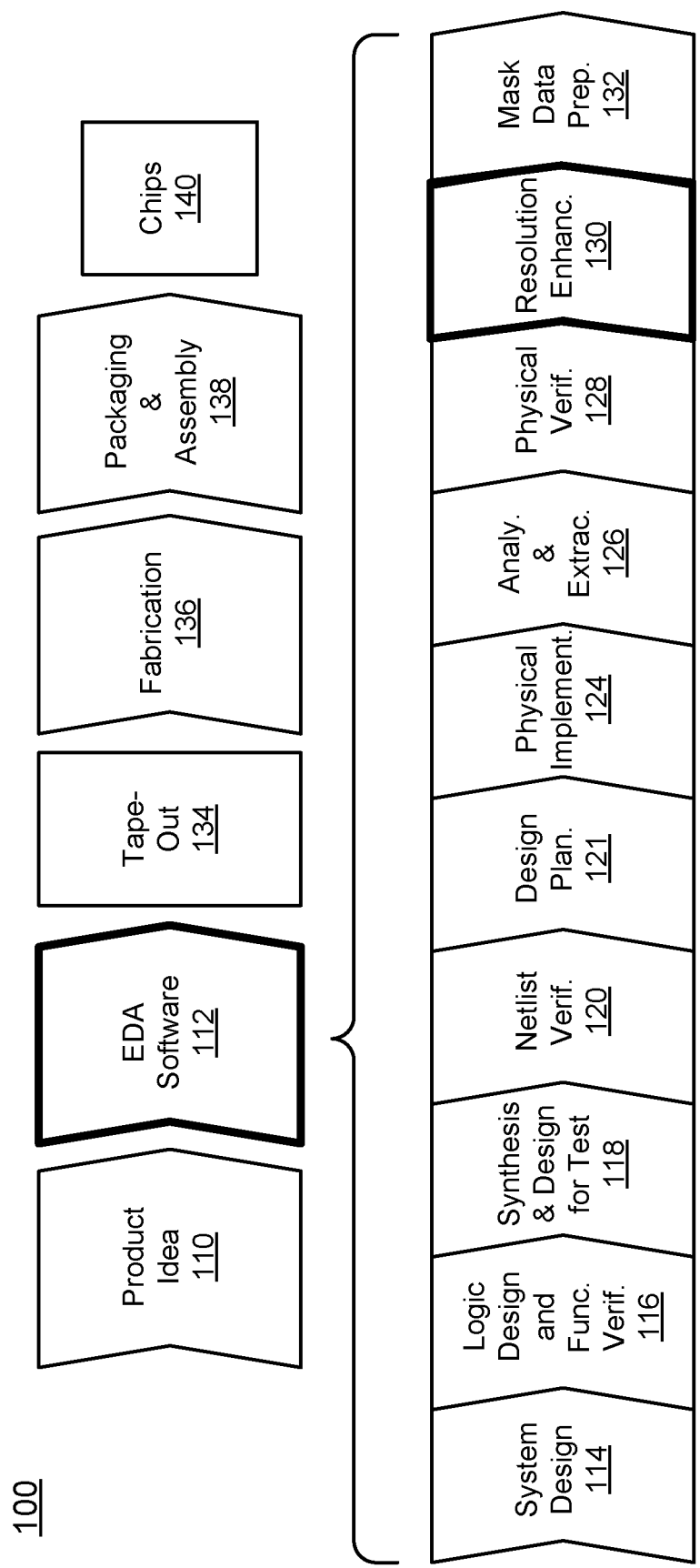
FIG. 1B is a flow diagram illustrating various operations in the design and fabrication of an integrated circuit.

Embodiments of the present disclosure can be used during one or more of the EDA stages described in FIG. 1B. Specifically, some embodiments of the present disclosure can be used in EDA software 112 as a part of physical verification 128 and/or resolution enhancement 130.

FIG. 1B illustrates various processes performed in the design and fabrication of an integrated circuit using software tools with a computer to transform data and instructions that represent the integrated circuit. The process shown in FIG. 1A may be used in the process of FIG. 1B. These processes start with the generation of a product idea 110 with information supplied by a designer and is realized during a design process that uses EDA software tools 112, which may also be signified herein as EDA software, as a design tool or a verification tool. When the design is finalized, it can be taped-out 134. After tape-out, a semiconductor die is fabricated 136 and packaging and assembly processes 138 are performed, which result in the finished integrated circuit 140 which may also be signified herein as a circuit, device, component, chip or SoC (system on chip).

Note that the design process that uses EDA software tools 112 includes operations 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

Then, during logic design and functional verification 116, VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test 118, VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification 120, the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning 122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation 124, the placement positioning of circuit elements such as transistors or capacitors and routing connection of the same by a plurality of conductors occurs. Exemplary EDA software products from Synopsys, Inc. of Mountain View, Calif. that can be used at this stage include: the Astro and IC Compiler products.

Then, during analysis and extraction 126, the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification 128, the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement 130, geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation 132, the "tape-out" data for production of masks to produce finished integrated circuits is provided. Exemplary EDA software products from Synopsys, Inc. of Mountain View, Calif. that can be used at this stage include the CATS family of products.

For all of the above mentioned integrated circuit design tools, similar tools from other EDA vendors, such as Cadence and Mentor Graphics, can be used as an alternative. Additionally, similarly non-commercial tools available from universities can be used.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Now consider the various steps of FIG. 1A in more detail, beginning with parameterization. Curves can be expressed in the form of parametric equations, by writing down the coordinates of the points that make up the curve as a pair of functions of some parameter t, i.e., $\gamma(t)=(x(t), y(t))$. For example, a unit circle can represented in parametric form as $(x(t)=\cos(t), y(t)=\sin(t))$.

The parametric representation of a curve has a simple interpretation. Imagine someone travels along the curve, and continuously records his coordinates (x,y) as functions of time t. The recorded coordinates are the parametric form of the curve. Also note that a parametric representation of a given curve is not unique. Using the above interpretation, if the traveler changes his speed while he travels along the curve, he will get a different parametric representation, even if he travels along the same path. In general, there are infinitely many possible parametric representations for a given curve.

Figure 2B:
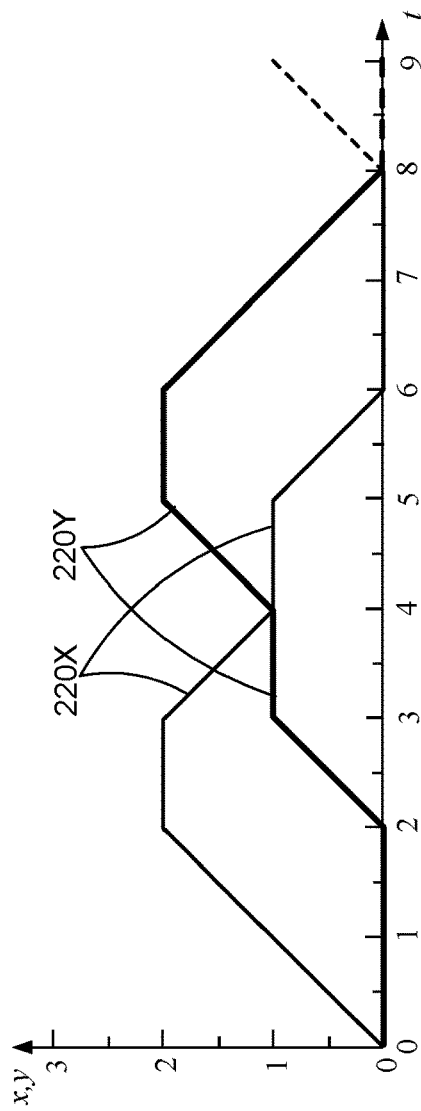
FIG. 2B shows a parametric representation of the polygon and rounded polygon of FIG. 2A.
Figure 2A:
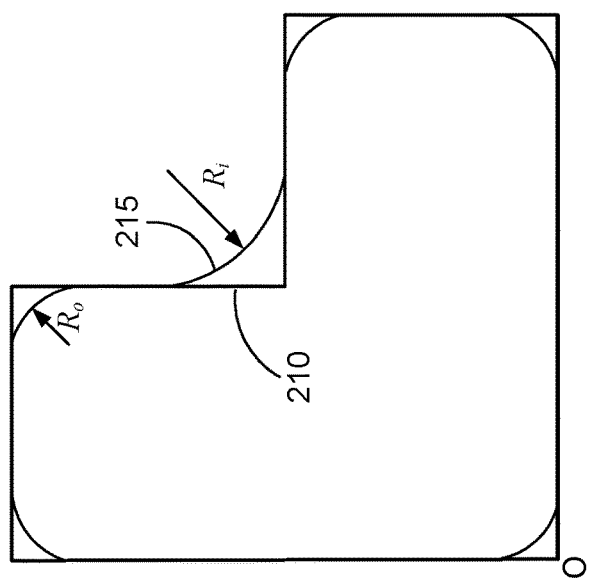
FIG. 2A shows a mask polygon with mask corner rounding with different inner and outer radii.

Here we give another example of parametric representation. In FIG. 2A, the boundary 210 is a two-dimensional representation of an L-shaped polygon with square corners. FIG. 2B is a parametric representation of the polygon, where function 220X corresponds to the x-coordinates of the polygon and function 220Y corresponds to the y-coordinates of the polygon. This parameterization starts at the origin O when t=0 and travels counter-clockwise around the polygon for increasing t. Also, since a polygon is a closed curve, when convenient, we may consider the parametric representation as a periodic function of parameter t, as indicated by the dashed extensions of the functions 220.

Returning to FIG. 2A, boundary 215 is the polygon after corner rounding. In this example, the outer (convex) corners are rounded with radius $R_o$ and the inner (concave) corners are rounded with radius $R_i$. Assuming the standard convention that the parameterization travels counter-clockwise around the boundary of the polygon (or clockwise around holes inside the polygon, so that the interior of the polygon is always to the traveler's left), at a given corner, if the traveler makes a left turn, that corner is said to be an "outer corner" or a "convex corner". Conversely, if the traveler makes a right turn, the corner is said to be an "inner corner" or a "concave corner". Polygon 210 with square corners is the input to the process of FIG. 1A, and polygon 215 with rounded corners is the desired output.

The local signed curvature of a parametric curve can be written as $$\mathcal{K} = \frac{x'y'' - y'x''}{(x'^2 + y'^2)^{\frac{3}{2}}} \qquad (1)$$

Here, a positive curvature corresponds to an outer or convex rounded corner, while a negative curvature corresponds to an inner or concave rounded corner. The radius of curvature of the curve is the reciprocal of the curvature:

$$r = \frac{1}{\mathcal{K}} = \frac{(x'^2 + y'^2)^{\frac{3}{2}}}{x'y'' - y'x''} \quad (2)$$

We will use Equations (1) and (2) below in the design of the smoothing filter f(t).

Begin by focusing on an isolated outer corner, with its vertex placed at the origin, as shown in FIG. 3A. The arrow shows the direction of increasing parameter t. We wish to transform the square corner 310 into a rounded corner 315, with some specified radius of curvature.

Now let us switch our view to the parametric representation of the corner and its rounded version. One possible parametric representation of the isolated corner is $$x = \begin{cases} 0: & t < 0 \\ Rt: & t \geq 0 \end{cases} \quad (3)$$

$$y = \begin{cases} -Rt: & t < 0 \\ 0: & t \geq 0 \end{cases} \quad (4)$$

where the parameter R is a scale factor that relates distance in the two-dimensional (x,y) representation to the parameter t. It can be thought of as the speed of a point moving along the edges of the corner and will sometimes be referred to as a speed parameter. The reason to include such a scale factor R will become apparent later. This representation is graphically shown in FIG. 3B, where the scale factor R is chosen to be 1. The line 320X corresponds to the x-coordinates of the corner and the line 320Y corresponds to the y-coordinates of the corner.

If the rounded corner is an arc of radius R, one possible parametric representation is $$x = \begin{cases} 0: & t < -1 \\ R - R\cos((t+1)\pi/4): & -1 \leq t \leq 1 \\ Rt: & t > 1 \end{cases} \quad (5)$$

$$y = \begin{cases} -Rt: & t < -1 \\ R - R\sin((t+1)\pi/4): & -1 \leq t \leq 1 \\ 0: & t > 1 \end{cases} \quad (6)$$

This representation of the rounded corner is plotted as curves 325X and 325Y in FIG. 3B. When compared to the parametric representation 320 of the original square corner, the parametric representation 325 of the rounded corner looks like a smoothed version of the original. As a result, we can apply a smoothing filter to the parametric representation 320 of the input polygon with square corners. The resulting parametric curves 325 will give us the polygon with rounded corners.

Note that the parametric representation of a given curve is not unique. Using the rounded corner example again, for any continuous function $\theta(t)$ such that $\theta(-1)=0$ and $\theta(1)=\pi/2$, the following parametric representation gives the same arc of radius R.

$$x = \begin{cases} 0: & t < -1 \\ R - R\cos(\theta(t)): & -1 \leq t \leq 1 \\ Rt: & t > 1 \end{cases} \quad (7)$$

$$y = \begin{cases} -Rt: & t < -1 \\ R - R\sin(\theta(t)): & -1 \leq t \leq 1 \\ 0: & t > 1 \end{cases} \quad (8)$$

This is an important fact because it gives us more design freedom to find a proper smoothing filter.

Let us formulate the procedure of corner rounding. Referring again to FIG. 1A, for a given input polygon 150, we first find 160 a parametric representation $\gamma(t)=(x(t), y(t))$. We then apply 170 a convolution filter f(t) and produce a smoothed parametric curve $\tilde{\gamma}(t)=(\tilde{x}(t), \tilde{y}(t))$, according to the convolution equations $$\tilde{x}(t) = \int_{-\infty}^{+\infty} x(t') f(t-t') dt' \quad (9)$$

$$\tilde{y}(t) = \int_{-\infty}^{+\infty} y(t') f(t-t') dt' \quad (10)$$

Finally, we construct 180 a rounded polygon by producing a list of vertices lying on the parametric curve. We do this by first creating a list of points $\{t_i\}$ and then calculating the corresponding vertices $\{(\tilde{x}(t_i), \tilde{y}(t_i))\}$. By connecting the vertices together, we get the resulting rounded polygon.

Since convolution is a linear operation, it is easy to prove mathematically that our corner rounding procedure outlined above is rotationally invariant. If the input polygon is rotated by any angle, the output will be identical, except that it is also rotated by the same angle.

Now let us turn our focus to the problem of designing the smoothing filter. Before we start to formulate the smoothing filter, let us first apply a few restrictions on the smoothing filter f(t). The first one is the normalization condition:

$$\int_{-\infty}^{+\infty} f(t) dt = 1 \quad (11)$$

This condition guarantees that a constant function remains the same constant function when the smoothing filter is applied. The next one is the symmetrical condition:

$$f(-t) = f(t) \quad (12)$$

This additional condition guarantees that a linear function remains the same linear function when the smoothing filter is applied.

The next three conditions are not strictly required, but we apply them for convenience. They require the smoothing filter to be non-negative, finitely supported, and that all moments of the filter exist:

$$f(t) \geq 0, \quad (13)$$

$$f(t) = 0 \text{ for } |t| > T, \quad (14)$$

$$m_n = \int_{-\infty}^{+\infty} t^n f(t) dt \text{ exists for any } n \geq 0 \quad (15)$$

where T is the support boundary for the filter f(t). Now let us apply a smoothing filter f(t) to Equations (3) and (4), the parametric representation of the isolated corner. We get:

$$\tilde{x}(t) = \begin{cases} 0: & t < -T \\ R\int_0^\infty t' f(t-t')dt': & -T \le t \le T \\ Rt: & t > T \end{cases} \quad (16)$$

$$\tilde{y}(t) = \begin{cases} -Rt: & t < -T \\ -R\int_{-\infty}^0 t' f(t-t')dt': & -T \le t \le T \\ 0: & t > T \end{cases} \quad (17)$$

Using integration by parts and the conditions above, these can be simplified to $$\tilde{x}(t) = \begin{cases} 0: & t < -T \\ RG(t): & -T \le t \le T \\ Rt: & t > T \end{cases} \quad (18)$$

$$\tilde{y}(t) = \begin{cases} -Rt: & t < -T \\ R[G(t) - t]: & -T \le t \le T \\ 0: & t > T \end{cases} \quad (19)$$

where $$G(t) = \int_{-\infty}^t F(s)ds \quad (20)$$

and $$F(t) = \int_{-\infty}^t f(d)ds \quad (21)$$

We may call F(t) the "cumulative filter function", and G(t) the "doubly cumulative filter function". Note that the symmetrical condition Equation (12) guarantees that G(T)=T Therefore Equations (18) and (19) are continuous at t=T It can also be verified that G(t)−G(−t)=t. We may use this identity to simplify some calculations.

Now let us determine the local curvature of the smoothed corner. Towards that end, we will focus on the case where −T≤t≤T, as the curvature is always zero when t is outside of this interval. We have $$\tilde{x}'(t) = R F(t) \quad (22)$$

$$\tilde{y}'(t) = R [F(t) - 1] \quad (23)$$

$$\tilde{x}''(t) = R f(t) \quad (24)$$

$$\tilde{y}''(t) = R f(t) \quad (25)$$

Putting these quantities into the radius of curvature Equation (2), we have $$r(t) = \frac{\{[F(t)]^2 + [F(t) - 1]^2\}^{\frac{3}{2}}}{f(t)} R \quad (26)$$

Note that the radius is proportional to the scale factor R. We will use this fact later.

We are particularly interested in the radius of curvature at the middle point where t=0. From the symmetrical condition we know that F(0)=0.5. Therefore, $$r(0) = \frac{R}{2\sqrt{2} f(0)} \quad (27)$$

The radius of curvature at the boundary may also of interest. Since F(−T)=0 and F(T)=1, we have $$r(\pm T) = \frac{R}{f(\pm T)}. \quad (28)$$

We can also easily calculate the coordinates of the middle point at t=0:

$$\tilde{x}(0) = R G(0) \quad (29)$$

$$\tilde{y}(0) = R G(0)$$

Now we have made enough preparations for designing the smoothing filter f(t).

In one approach, we design a filter that produces a rounded corner that approximates a circular arc. Since a circular arc of radius R connects smoothly with the original corner at two points (0, R) and (R, 0), we see that the extent T of the filter must be T=1. Now let us assume the filter f(t) can be written as a polynomial. Since the filter is symmetrical, all odd terms of such polynomial must vanish. Therefore, we can write the filter and its cumulative forms as $$f(t) = \sum_{j=1}^{K} (2j-1)c_j t^{2j-2} \quad (30)$$

$$F(t) = \frac{1}{2} + \sum_{j=1}^{K} c_j t^{2j-1} \quad (31)$$

$$G(t) = \frac{t+1}{2} + \sum_{j=1}^{K} \frac{1}{2j} c_j (t^{2j} - 1) \quad (32)$$

where K is the number of terms we wish to use, and $c_j$ are the unknown coefficients to be determined. Note again that we only write the equations for f(t), F(t), and G(t) in the interval −1≤t≤1. The values of these functions outside of the interval are trivially either 0 or 1.

The normalization condition requires that $$\sum_{j=1}^{K} c_j = \frac{1}{2} \quad (33)$$

We want to place the middle point of the rounded corner on the circular arc, which should be (R(1−√2/2), R(1−√2/2)). Comparing to Equations (29) and (32), we have $$\sum_{j=1}^{K} \frac{1}{2j} c_j = \frac{\sqrt{2}}{2} - \frac{1}{2} \qquad (34)$$

We also want the radius of curvature at the middle point (t=0) to be exactly R. By using Equations (27) and (30), we have $$c_1 = \frac{\sqrt{2}}{4} \qquad (35)$$

Finally, we want the radius of curvature at the boundary (t=±1) to also be exactly R. By using Equations (28) and (30), we have $$\sum_{j=1}^{K} (2j-1) c_j = 1 \qquad (36)$$

So far we have 4 independent equations, which can support 4 degrees of freedom. So we set K=4 and solve for the 4 unknown coefficients. This gives us the following:
 $c_1$=+0.351502780927832714
 $c_2$=+0.109710728426252374
 $c_3$=−0.022829799636003067
 $c_4$=+0.061616290281917924
The above coefficients have been slightly nudged, to provide better overall optimization. This was done by slightly changing the position of the middle point and the curvatures at the three anchor points. The idea is to do a "min-max" optimization of radius distortion. The maximum distortion in radius from a perfect circular arc is only $4.33 \times 10^{-5}$.

Figure 4:
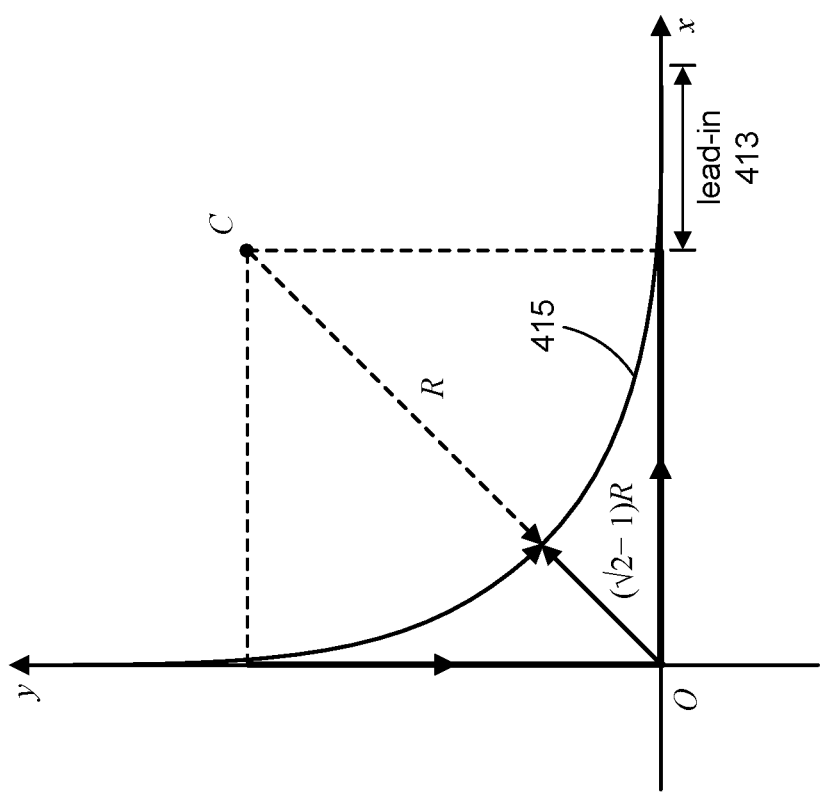
FIG. 4 shows a rounded corner with some "lead-in".

In another approach, we design a filter without a sudden change of curvature at the boundary of the rounded corner. In this example, we give up the idea of producing a perfect circular arc. Instead, as shown in FIG. 4, we allow some "lead-in" 413, within which the curvature of the rounded mask starts to smoothly ramp up, before the "main" rounded mask contour 415 starts. This means that our filter function should have a larger support. The filter value should be nonzero in the interval (−1−1, 1+1), where 1 is the lead-in length. Furthermore, the filter function value at the supporting boundary should be zero. We will further require that the first derivative of the filter at the boundary to be zero, such that we have a smooth lead-in. We will also require that our filter has a single peak at the middle, and it should be smooth.

Bearing the above requirements in mind, we choose a family of functions to start with. Here, we choose the following functional form:

$$f(t) = \frac{a}{T} \cos^2\left[\frac{\pi}{2} p\left(\frac{|t|}{T}\right)\right] \quad -T \le t \le T \qquad (37)$$

where a is the normalization parameter, and T>1 defines the support of the filter. Function p(x) is a monotonically increasing function in [0,1] and maps it into [0,1]. It is used here to fine-tune the shape of the filter. In the example below, we use a power function for p(x):

$$p(x) = x^w \qquad (38)$$

where w is a design parameter to be determined, which controls the shape of the filter. Note that, by construction, the filter value and its first derivative of Equation (37) vanish at the support boundary, thereby providing a smooth transition at the support boundary.

Since we are no longer trying to make the rounded corner a circular arc, the radius of curvature of the curve is no longer expected to be a constant. Here we adopt the following convention to define the contour radius. The distance d from the contour middle point to the original corner should be d=(√2−1)R if the contour was a circular arc. We therefore define the ratio d/(√2−1) as the radius of our rounded corner. Using Equation (29), this gives us a design constraint that $$G(0) = 1 - \frac{\sqrt{2}}{2} \qquad (39)$$

Note that with the filter function (37), the "doubly cumulative filter function" G(t) is proportional to the support width parameter T. We therefore use Equation (39) to determine the support width parameter T.

Now we need a design target. One choice is the rounded corner produced by a Gaussian e-beam model created for an isolated corner. Mathematically, such Gaussian-rounded corner is an implicitly defined curve:

$$\Phi\left(\frac{x}{\sigma}\right) \Phi\left(\frac{y}{\sigma}\right) = 0.5 \qquad (40)$$

where $\Phi(x)$ is the cumulative distribution function of a standard normal distribution, and σ is the standard deviation of the Gaussian distribution. σ can be related to our radius R by using our definition $$\Phi^2\left[\frac{\left(-1\frac{\sqrt{2}}{2}\right)R}{\sigma}\right] = 0.5 \qquad (41)$$

or $$\sigma = \frac{1 - \frac{\sqrt{2}}{2}}{\Phi^{-1}\left(\frac{\sqrt{2}}{2}\right)} R \approx 0.537466 \, R \qquad (42)$$

By using the curvature formula for implicit curve F(x, y)=0, $$\mathcal{K} = -\frac{(-F_y \; F_x)\begin{pmatrix} F_{xx} & F_{xy} \\ F_{yx} & F_{yy} \end{pmatrix}\begin{pmatrix} -F_y \\ F_x \end{pmatrix}}{(F_x^2 + F_y^2)^{\frac{3}{2}}}, \qquad (43)$$

we can numerically find out that the radius of curvature of the Gaussian e-beam contour at the middle point is $$R_g = 1.3575728 \sigma \qquad (44)$$

Together with Equation (42), we have $$R_g = 0.72964913 R \qquad (45)$$

By using Equation (27) to match the radius of curvature to the Gaussian contour, we get another design constraint:

$$f(0)=0.48455261. \tag{46}$$

Solving the above constraints for the parameters a, T, and w, we have $$a=0.8935758032751147$$

$$T=1.8441254750117611$$

$$w=1.2282704 \tag{47}$$

Recall that the radius of curvature of the smoothed curve is proportional to the speed parameter R. It is also proportional to the support parameter T Therefore, the radius of curvature is proportional to the product RT. Here we have some redundancy in parameters. If we replace the speed parameter R with RT, and scale the filter such that T=1, we should get the same smoothed curve. We will do this from now on, so our filter always has a support of [−1, 1]. Hence, the equation of our final smoothing filter is $$f(t) = 0.8935758032751147 \cos^2\left(\frac{\pi}{2}|t|^{1.2282704}\right) \tag{48}$$

$$-1 \le t \le 1$$

Figure 6:
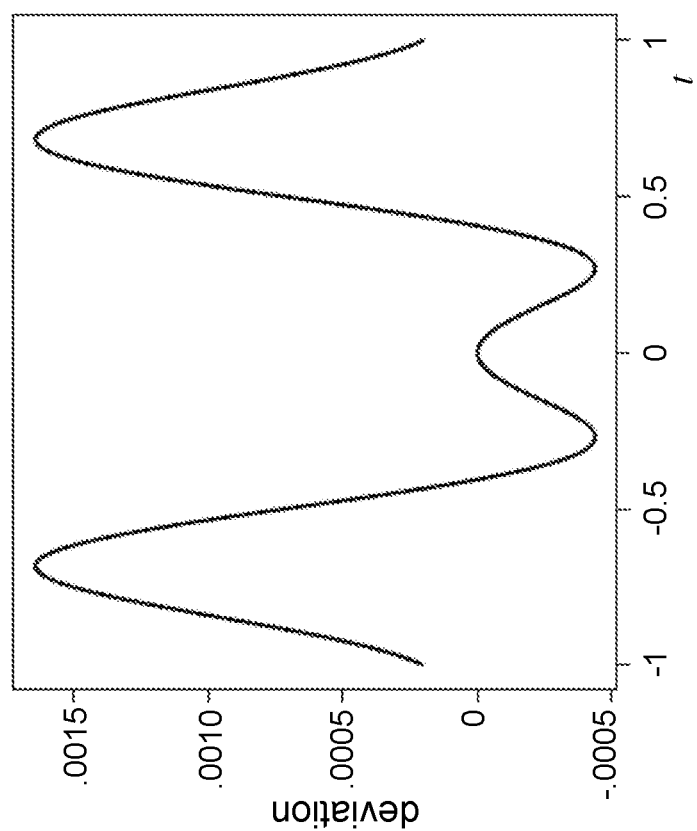
FIG. 6 plots deviation of the rounded corner to the target rounded corner produced by a Gaussian e-beam model.
Figure 5:
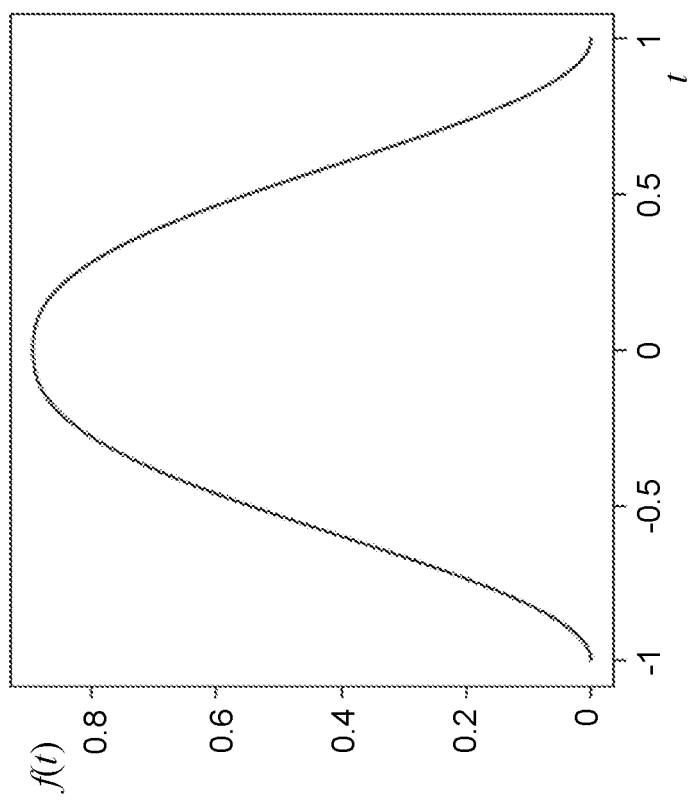
FIG. 5 shows a filter that generates a rounded corner that matches the Gaussian smoothed corner.

FIG. 5 shows the shape of this smoothing filter f(t). This filter possesses the desired bell shape. FIG. 6 shows the deviation of the rounded corner produced by this smoothing filter compared to the rounded corner produced by a Gaussian e-beam model. A positive deviation means the deviation is towards the outer side of the rounded corner. The maximum deviation is less than 0.17%.

The development so far has considered a single corner in isolation. This can be extended to multiple corners assuming a single radius for both outer (convex) corners and inner (concave) corners. In reality, the lithographic masks produced in a mask shop often exhibit different radii for outer corners and inner corners. An MCR model should be able to handle outer corners and inner corners differently, and produce different amounts of corner rounding.

Recall that the parametric representation of a given input polygon is not unique. Further recall that in Equation (26), the radius of curvature of the smoothed corner is proportional to the scale factor R. This fact gives us a relatively simple way to produce different radii for outer corners and inner corners. If we assign a different scale factor R near inner corners to that used near outer corners, the new parametric formula still represents the same polygon. However, the radius of curvature after applying the smoothing filter will be different for outer corners and inner corners. If we set the scale factor to $R_oT$ near outer corners and to $R_iT$ near inner corners, we can achieve the desired outer and inner radii.

Figure 7B:
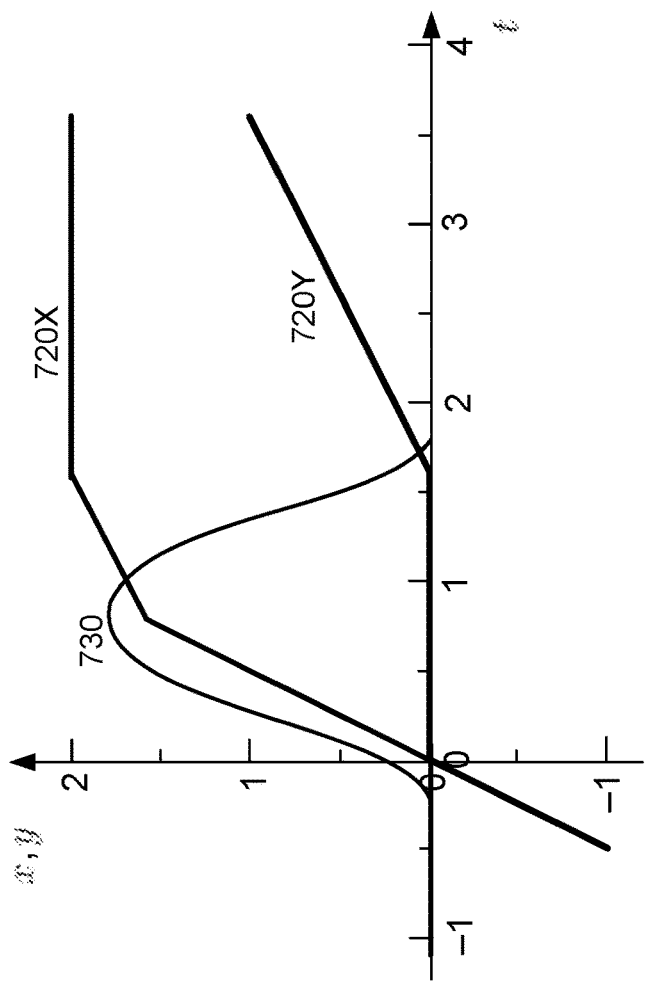
FIG. 7B shows a parametric representation of the boundary segment containing the two corners in FIG. 7A.
Figure 7A:
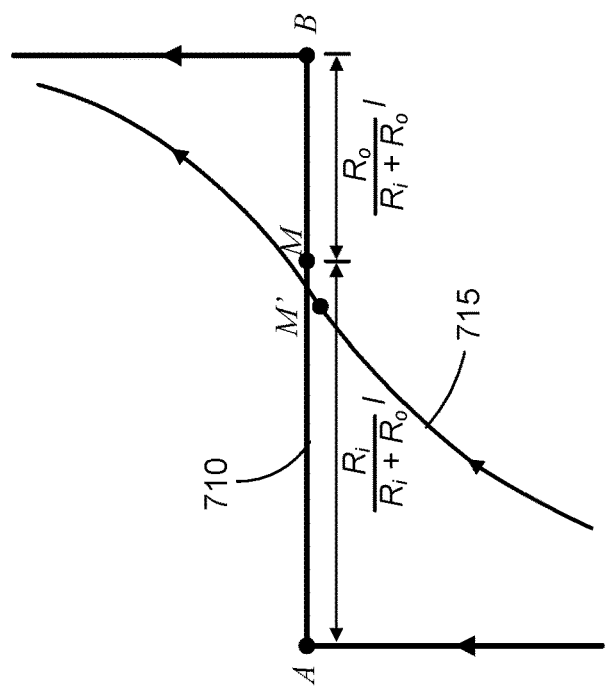
FIG. 7A shows the division of an edge shared by an inner corner A and an outer corner B, using the equi-time rule.

Now consider a boundary 710 which has an edge shared by a pair of neighboring inner and outer corners, as shown in FIG. 7A. We set the scale factor to $R_iT$ near the inner corner A and to $R_oT$ near the outer corner B. But where should we divide the edge? Here we will use a simple equi-"time" rule. We will let the traveler spend equal time (meaning: equal range of parameter t) with speed $R_iT$ and with speed $R_oT$ This way, the edge is divided with a length ratio of $R_i:R_o$.

Consider the situation shown in FIG. 7A. Suppose the "time" parameter t is 0 when the traveler reaches corner A with speed $R_i$. The traveler moves towards point B at speed $R_i$ for time τ. The traveler then changes the speed to $R_o$ and spends the same time τ before he reaches point B. After that he moves upward at constant speed $R_o$. We further assume that segment AB has length l (lowercase "el"). The parametric representation of the jog shown in FIG. 7A can be written as $$x = \begin{cases} 0: & t < 0 \\ R_i t: & 0 \le t < \tau \\ R_i \tau + R_0(t-\tau): & \tau \le t < 2\tau \\ (R_i + R_o)\tau: & t \ge 2\tau \end{cases} \tag{49}$$

$$y = \begin{cases} R_i t: & t < 0 \\ 0: & 0 \le t < 2\tau \\ R_o(t - 2\tau): & t \ge 2\tau \end{cases} \tag{50}$$

FIG. 7B plots this parametric representation. Curve 720X is x(t) and curve 720Y is y(t). Also shown in FIG. 7B is the smoothing filter 730 centered at t=0.8. Obviously, we have the constraint that $$(R_i+R_0)\tau=1 \tag{51}$$

This immediately gives us the time period τ

$$\tau = \frac{l}{R_i + R_o} \tag{52}$$

The parametric formula for the rounded curve can be determined by using Equations (9) and (10). After some development using integral by parts, we have:

$$\tilde{x}(t) = R_i \max(0, \min(\tau, t+1)) + R_o \max(0, \min(\tau, t-\tau+1)) - \tag{53}$$
$$R_i[G(\tau-t) - G(-t)] - R_o[G(2\tau-t) - G(\tau-t)]$$

$$\tilde{y}(t) = -R_i G(-t) + R_o G(t-2\tau) \tag{54}$$

Particularly, when t=τ, we have $$\tilde{x}(\tau)=R_i\tau-(R_i-R_0)[G(0)-G(-\tau)] \tag{55}$$

$$\tilde{y}(\tau)=-(R_i-R_o)G(-\tau) \tag{56}$$

FIG. 7A shows the boundary 715 after the smoothing filter is applied. Note that these two corners are close enough to interact. Neither corner has a fully rounded corner. One advantage of the current approach is the ability to handle geometries like this. It is easy to see that after the smoothing filter is applied, the dividing point is pulled towards the corner with the larger radius (the inner corner A in this example), as marked by point M' in FIG. 7A.

The following is a description of another method for estimating corner rounding in lithographic masks, according to the invention. The steps below are numbered for convenience, but they are not always required to be performed in an order according to the numbering.

Step 1. Preprocessing Input Polygons.

The input polygons in the design layout are preprocessed to remove redundant vertices and collinear edges. If input polygons contain holes with cutline representation, they may be converted to island representation.

Step 2. Assigning Scale Factors.

Each polygon vertex is assigned a scale factor. In one approach, the scale factor is set to $R_iT$ for inner corners and to $R_oT$ for outer corners, where T is the filter support width parameter as determined in Equation (48) and $R_i$ and $R_o$ are the radius of curvature for the inner and outer corners. It is also possible to assign scale factors using other algorithms. For example, the scale factor might depend on the distance to nearby vertices, or on the turning angle of each vertex. We could even use a sophisticated model, which calculates the scale factor based on the local polygon density and/or other information, and use that to assign the scale factor. This can give us more flexibility in mask modeling.

Step 3. Dividing Edges Shared by Inner and Outer Corners.

Each edge shared by a pair of corners assigned different scale factors is divided into two segments, for example as described above based on the equi-time rule, although other methods may also be used. This will insert a "virtual vertex" for each such edge.

Step 4. Converting to Parametric Representation.

Each polygon is converted to its parametric representation. The parametric representation can be stored as a vector of triplets $(t_i, x_i, y_i)$, where each element triplet corresponds to a polygon vertex, or a "virtual vertex" introduced in the previous step as dividing point. The value $t_i$ can be determined by edge lengths and scale factors.

Step 5. Identifying "Corner Clusters."

Corners are grouped into "clusters." Two neighboring corners belong to the same "cluster" if the difference in their time parameter is less than some critical time elapse $\tau_c 0$, i.e., $t_{i+1}-t_i<\tau_c 0$. The parameter $\tau_c 0$ will be described below, for example see Equation (62). Corners within the same cluster may interact with each other (e.g., as shown in FIG. 7A) and are processed together. Corners belonging to different clusters are far enough away from each other and can be processed without regard to each other.

Step 6. Determining Sample Points $t_j$.

Figure 8:
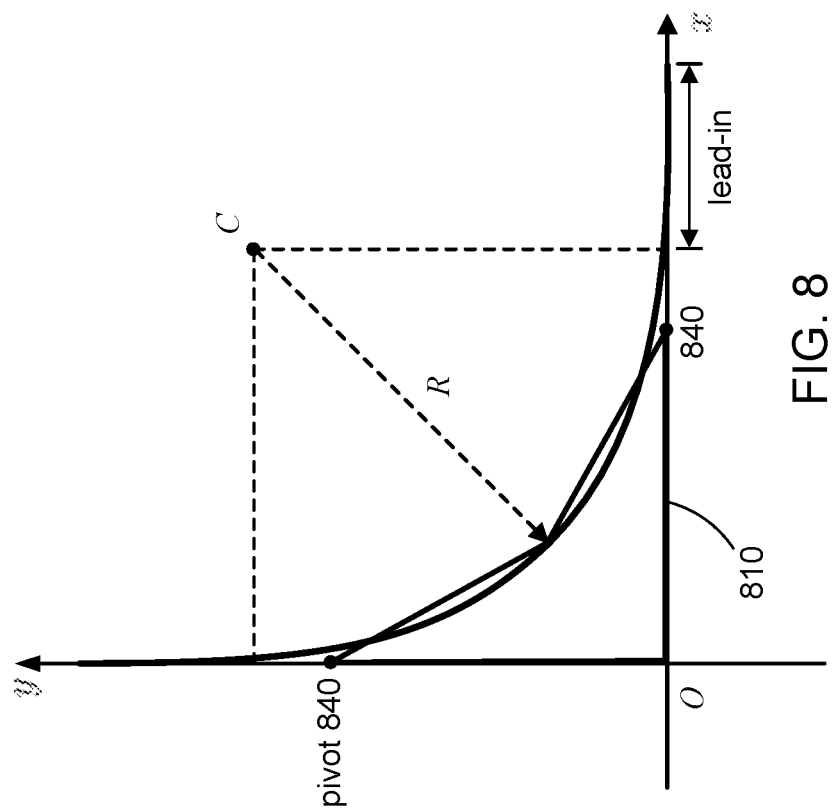
FIG. 8 shows an area conservation rule to determine pivot points.

Assume a cluster contains n consecutive corners, indexed from j to j+n−1. We calculate nK+1 points to represent the rounded version of the cluster, where K is an adjustable parameter that controls the granularity of the output rounded layout. In one approach, the first point is evaluated at parameter value $t=t_j-1$, and the last point is evaluated at parameter value $t=t_{j+n-1}+1$. These two point are called the "pivot points." As shown in FIG. 8, the pivot points 840 are located on the original polygon edges and the rounded contour 815 may deviate from the original polygon edges 810 only between these two pivot points 840. The rest of the nK−1 samples are distributed uniformly in t between the two pivot points.

However, recall that when we designed the smoothing filter, we intentionally introduced lead-ins at both ends of a rounded corner. With that particular designed filter, the rounded corner starts to deviate from the original path at a distance of RT away from an isolated corner, where T≈1.84. The rounded corner deviates laterally from the original path by about 0.02R at a distance R from the original corner. Such small deviation is ignored, especially when we only need a relatively coarse-grained representation of the rounded contour. For this reason, we will slide the pivot points along the original path towards the original corner, by some distance to be determined below.

How far should we slide the pivot points? In one approach, we introduce a rule of area conservation. As illustrated in FIG. 8, when a coarse-grained rounded corner is represented by a K-segment polyline, we want to slide the pivot points such that the area of the polygonal region bounded by the coarse-grained rounded corner and the coordinate axes equals the area of the region bounded by the rounded corner and the coordinate axes. The latter area can be calculated by:

$$A = \frac{1}{2}T^2 \int_{-1}^{1} [\tilde{y}(t)\tilde{x}'(t) - \tilde{x}(t)\tilde{y}'(t)]dt \qquad (57)$$

$$= \frac{1}{2}T^2 \int_{-1}^{1} [G(t) - t F(t)]dt \approx 0.247959062$$

Suppose we allocate the K+1 time points for the K-segment coarse-grained rounded curve at $t_j=(2j/K-1)\tau_0$, for j=0, ..., K, then the coordinates of the K+1 points on the coarse-grained curve will be $$\tilde{x}(t_j) = \begin{cases} 0: & j = 0 \\ TG(t_j): & j = 1, \ldots, K \end{cases} \qquad (58)$$

$$\tilde{y}(t_j) = \begin{cases} TG(-t_j): & j = 0, \ldots, K-1 \\ 0: & j = K \end{cases} \qquad (59)$$

Note that the two pivot points (the first and last points) are snapped onto the coordinate axes.

The area of the polygonal cutout can now be computed as $$\hat{A}(\tau_0) = \frac{1}{2}\sum_{j=0}^{K-1} [\tilde{x}(t_{j+1}) - \tilde{x}(t_j)][\tilde{y}(t_j) + \tilde{y}(t_{j+1})] \qquad (60)$$

By equating $\hat{A}(\tau_0)$ to A and solving for $\tau_0$, we can find where to place the pivot points, given the number of segments K. The table below shows the first few values of $\tau_0$ and the y-coordinate of the corresponding starting pivot point.

| K | 1 | 2 | 3 | 4 | 5 | 6 |
|---|---|---|---|---|---|---|
| $\tau_0$ | 0.3432130 | 0.4368352 | 0.4903453 | 0.5264224 | 0.5533911 | 0.5747218 |
| $\tilde{y}(-\tau_0)$ | 0.7042145 | 0.8465852 | 0.9326821 | 0.9924289 | 1.0378980 | 1.0743106 |

| K | 7 | 8 | 9 | 10 | 11 | 12 |
|---|---|---|---|---|---|---|
| $\tau_0$ | 0.5992876 | 0.6071407 | 0.6199713 | 0.6312259 | 0.6412996 | 0.6502109 |
| $\tilde{y}(-\tau_0)$ | 1.1045732 | 1.1303455 | 1.1527359 | 1.1724684 | 1.1900768 | 1.2059387 |

| K | 13 | 14 | 15 | 16 | 17 | 18 |
|---|---|---|---|---|---|---|
| $\tau_0$ | 0.6583474 | 0.6657709 | 0.6725883 | 0.6788822 | 0.6847218 | 0.6001620 |
| $\tilde{y}(-\tau_0)$ | 1.2203501 | 1.2335317 | 1.2456639 | 1.2568867 | 1.2673177 | 1.2770507 |

Step 7. Preventing Line-End Pullback.

Line-end pullbacks are typically undesired in an MCR contour, because such effects should have already been addressed in Mask Error Correction. Consider an edge at a line-end for which the rounding radius is set to R. The maximum pullback happens at the middle of the edge. This maximum amount of pullback can be determined as $$2RT\, G(-\tau/2) \tag{61}$$

where $\tau$ is the time duration of the edge. When $\tau \geq 2$ there is no pullback. However, if the edge is only slightly shorter, the resulting pullback is typically pretty small and not perceivable, due to the fact that our filter produces a lead-in. Practically, we consider any pullback smaller than 0.25% of the corner radius tolerable and not perceivable. Using this criterion, we can determine the critical time $\tau_c$ for which line-end pullback starts to happen.

$$\tau_c = -2G^{-1}(0.00125/T) \tag{62}$$

This critical time $\tau_c$ is also used to determine corner clusters, as described earlier. In these examples, the actual value of $\tau_c$ is about 1.55.

When a line-end edge has a duration shorter than $\tau_c$, significant pullback happens. To prevent line-end pullback from happening, we increase the time duration of the edge to $\tau_c$. The resulting vertex is then snapped onto the original edge, to eliminate remaining tiny tolerable pullback.

Step 8. Preventing Discontinuity.

Note that the values of pivot time listed in the table above are smaller than half of the critical time $\tau_c$. This can cause a subtle problem. When the edge duration of a line-end is longer than $\tau_c$, the rounded corner starts to deviate from the original corner at pivot time $\tau_0$. However, when the edge duration reaches $\tau_c$, the two corners of the edge belong to the same cluster. The rounded corner starts to deviate from the original corner at half the critical time $\tau_c$. Therefore, the shape of the rounded corner undergoes a sudden jump at edge duration of $\tau_c$. This is usually not desired, as it can cause difficulties in OPC convergence.

To eliminate such discontinuity, we may introduce a transition zone in time duration. When the time duration is slightly larger than $\tau_c$, but still smaller than another parameter $\tau_s$, we will add another time node outside of the pivot time T0. This extra time node is placed at $\tau_c/2$ away from the corner. Therefore, the rounded coordinates for the extra time node can always be considered on the original edge. In the meanwhile, the pivot point is no longer snapped onto the original edge. Instead, it is only "partially" snapped, meaning that we move the calculated pivot point (which is slightly off the original edge) towards its projection point on the original edge, by some distance. The distance moved is a fraction of the full distance. The fraction is a function of the line duration. A simple solution would be to let it linearly ramp up from 0 to 1 as the edge time duration increases from $\tau_c$ to $\tau_s$. The parameter $\tau_s$, which we may call "isolated time," can be chosen such that the line-end pullback at the time duration is negligibly small, say, less than 0.1% of corner radius. Therefore, $$\tau_s = -2G^{-1}(0.0005/T) \tag{63}$$

In these examples, the actual value of $\tau_s$ is about 1.64. Of course, the criteria to determine $\tau_c$ and $\tau_s$ may be adjusted.

Step 9. Handling Fine-Manhattan Inputs.

If the input polygons are so-called fine-Manhattan polygons, which contains many short line segments, a corner cluster may include many vertices closely placed to each other. The above procedure may produce many more vertices in the output than needed. We may try to reduce the number of vertices by limiting the time step size $\Delta t$ between two consecutive time nodes. For an isolated corner, the time step is $\Delta t = 2\tau_0/K$. As one rule, we will keep the time step for any given corner cluster no smaller than half of that. Assuming the total time elapse of a corner cluster is T, we will then limit the number of time steps to $K' = \min(nK, \lceil KT/\tau_0 \rceil)$, and the total number of time nodes becomes $K'+1$.

Step 10. Evaluating Contour Vertices at Sample Points.

To evaluate the coordinates of the rounded contour at each assigned sample point $t_i$, we use Equations (9) and (10). We notice that the parametric formula for input polygons consists of piece-wise linear functions, we may evaluation Equations (9) and (10) by summing over the contributions from each piece. Consider a linear piece, running from $(t_i, x_i)$ to $(t_{i+1}, x_{i+1})$, we want to evaluate its contribution to the rounded contour at parameter value t. Equation (9) is simplified to $$\tilde{x}_i(t) = \int_{t_i}^{t_{i+1}} \left( x_i + \frac{x_{i+1} - x_i}{t_{i+1} - t_i} t' \right) f(t - t') dt' \tag{64}$$

If we have the condition $t-1 \leq t_i < t_{i+1} \leq t+1$ (otherwise we can always clip the linear piece to meet the condition), the above integration can be evaluated as $$\tilde{x}_i(t) = [x_{i+1} F(t_{i+1} - t) - x_i F(t_i - t)] - \frac{x_{i+1} - x_i}{t_{i+1} - t_i} [G(t_{i+1} - t) - G(t_i - t)] \tag{65}$$

This is a simple formula, we do not need any numerical integration or convolution calculation at run time. For each sample point t, we can first find out all the "active pieces", whose time interval has a non-empty intersection with the interval $[t-1, t+1]$. For each active piece, we first clip it so that it completely falls within the interval $[t-1, t+1]$ and use the formula above to calculate its contribution to the final answer. Summing over all active pieces gives us the resultant $\tilde{x}(t)$. The y-coordinate can be computed similarly.

Step 11. Simplifying Partial Contours for Corner Clusters.

If needed, we can use certain algorithms to eliminate some nearly collinear line segments, to reduce the final number of vertices. For example, the Ramer-Douglas-Peucker algorithm can be used for this purpose.

Step 12. Connecting Partial Contours Together and Output the Final Results.

If a polygon was divided into different corner clusters, the partial contours from the different corner clusters are combined to yield the complete rounded polygon.

Figure 9:
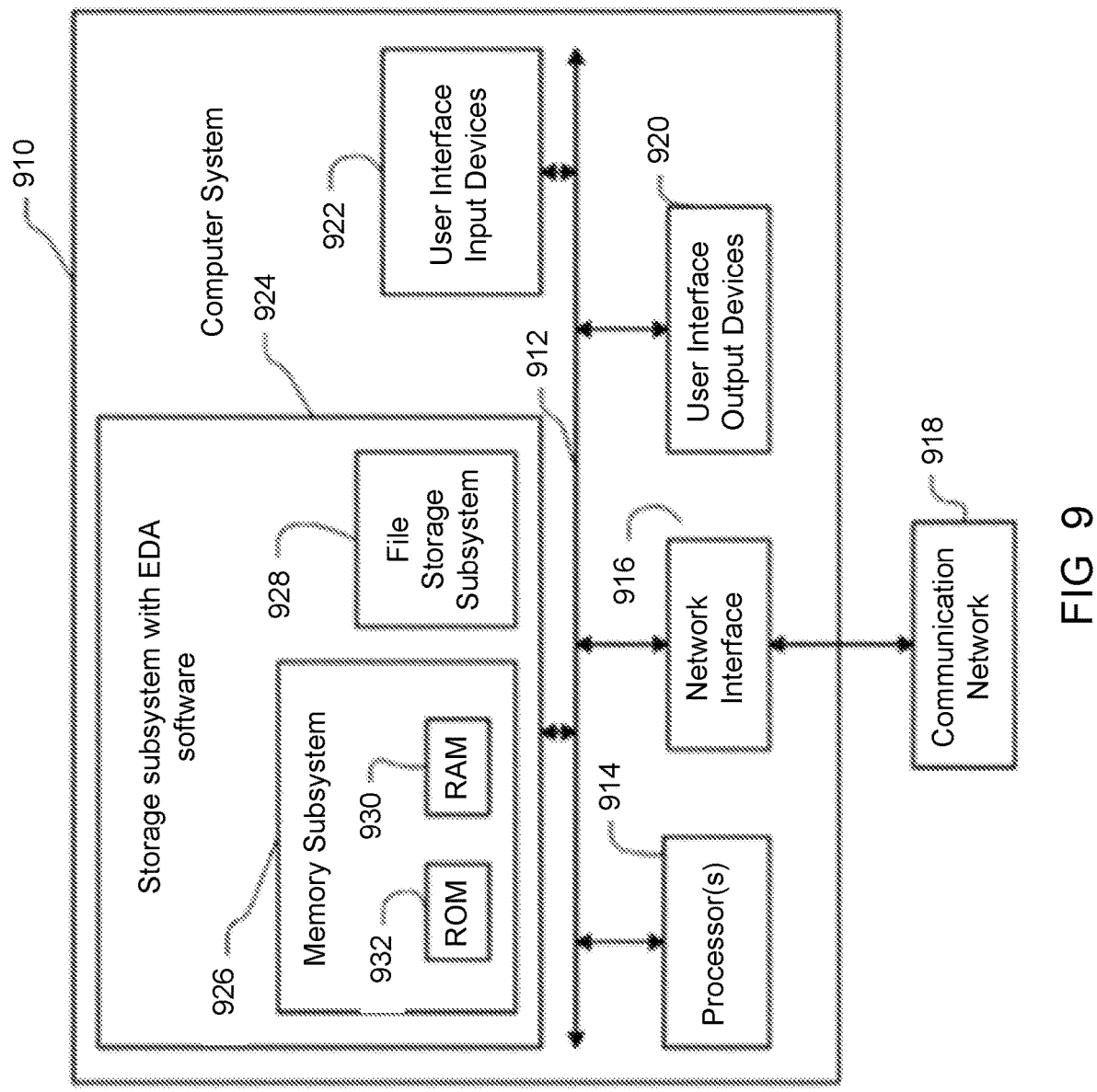
FIG. 9 is a block diagram of one embodiment of a computer system that may be used with the present invention.

FIG. 9 is a block diagram of one embodiment of a computer system 910 that may be used with the present invention. The computer system 910 typically includes at least one computer or processor 914 which communicates with a number of peripheral devices via bus subsystem 912. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms "processor" and "computer" are further defined below. These peripheral devices may include a storage subsystem 924, comprising a memory subsystem 926 and a file storage subsystem 928, user interface input devices 922, user interface output devices 920, and a network interface subsystem 916. The input and output devices allow user interaction with computer system 910.

The computer system may be a server computer, a client computer, a workstation, a mainframe, a personal computer (PC), a tablet PC, a rack-mounted "blade" or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term "processor" here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the operations discussed herein. Due to the ever-changing nature of computers and networks, the description of computer system 910 depicted in FIG. 9 is intended only as one example for purposes of illustrating the preferred embodiments. Many other configurations of computer system 910 are possible having more or less components than the computer system depicted in FIG. 9.

Network interface subsystem 916 provides an interface to outside networks, including an interface to communication network 918, and is coupled via communication network 918 to corresponding interface devices in other computer systems or machines. Communication network 918 may comprise many interconnected computer systems, machines and communication links. These communication links may be wireline links, optical links, wireless links, or any other devices for communication of information. Communication network 918 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 922 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 910 or onto communication network 918. User interface input devices typically allow a user to select objects, icons, text and the like that appear on some types of user interface output devices, for example, a display subsystem.

User interface output devices 920 may include a display subsystem, a printer, or non-visual displays such as audio output devices. The display subsystem may include a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 910 to the user or to another machine or computer system.

Memory subsystem 926 typically includes a number of memories including a main random-access memory (RAM) 930 (or other volatile storage device) for storage of instructions and data during program execution and a read only memory (ROM) 932 in which fixed instructions are stored. File storage subsystem 928 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 928.

Bus subsystem 912 provides a device for letting the various components and subsystems of computer system 910 communicate with each other as intended. Although bus subsystem 912 is shown schematically as a single bus, alternative embodiments of the bus subsystem may use multiple busses. For example, RAM-based main memory can communicate directly with file storage systems using Direct Memory Access (DMA) systems.

As used herein, the term "module" signifies a tangible data and information processing device, that typically is limited in size and/or complexity. For example, the term "module" can signify one or more methods or procedures that can transform data and information. The term "module" can also signify a combination of one or more methods and procedures in a computer program. The term "module" can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilinx or Intel's Altera), Random Access Memories (RAMs) or microprocessors. A module is configured to process data and information, typically using a sequence transformations (also referred to as "operations") applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a process comprising a sequence or set of operations or instructions that a module can use to transform data and information to achieve a result. A module can comprise one or more algorithms. As used herein, the term "thread" refers to a sequence of instructions that can comprise a subset of the instructions of an entire process or algorithm. A process or algorithm can be partitioned into multiple threads that can be executed in parallel.

As used herein, the term "computer" includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term "software" or "program" signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

The invention claimed is:

1. A method implemented on a computer system executing instructions to estimate corner rounding in lithographic masks, the method comprising:

accessing a design layout of a lithographic mask, the design layout comprising a plurality of polygons described by two-dimensional representations in (x,y) of boundaries of the polygons;

calculating parametric representations γ(t)=(x(t), y(t)) of the two-dimensional representations of the polygon boundaries, wherein the parametric representations are a function of the parameter t;

applying a smoothing filter f(t) to the parametric representations γ(t) to produce smoothed parametric representations $\tilde{\gamma}(t)$;

calculating smoothed two-dimensional representations of the polygon boundaries from the smoothed parametric representations $\tilde{\gamma}(t)$, wherein the smoothed two-dimensional representations of the polygon boundaries have rounded corners on the polygon boundaries; and altering the design layout of the lithographic mask based on the smoothed two-dimensional representations of the polygon boundaries with rounded corners.

2. The computer-implemented method of claim 1 wherein the smoothing filter f(t) satisfies a normalization condition $$\int_{-\infty}^{+\infty} f(t)dt = 1$$

and a symmetrical condition $$f(-t)=f(t).$$

3. The computer-implemented method of claim 2 wherein the smoothing filter f(t) further satisfies conditions $$f(t) \geq 0,$$
$$f(t) = 0 \text{ for } |t| > T,$$
$$m_n = \int_{-\infty}^{+\infty} t^n f(t) dt \text{ exists for any } n \geq 0$$

where T is a support boundary of the smoothing filter f(t).

4. The computer-implemented method of claim 1 wherein the smoothing filter f(t) is smooth and contains a single peak.

5. The computer-implemented method of claim 1 wherein the smoothing filter f(t) is given by $$f(t) = \frac{a}{T} \cos^2\left[\frac{\pi}{2} p\left(\frac{|t|}{T}\right)\right]$$
$$-T \leq t \leq T$$

where a is a normalization parameter, T is a support boundary of the smoothing filter f(t), and p(x) is a monotonically increasing function in [0,1].

6. The computer-implemented method of claim 5 wherein $$p(x) = x^w$$

where w is a parameter.

7. The computer-implemented method of claim 1 wherein the polygon boundaries have rounded corners with different radii of curvature.

8. The computer-implemented method of claim 7 wherein concave corners have a first radius of curvature and convex corners have a different second radius of curvature.

9. The computer-implemented method of claim 7 wherein the radius of curvature for a corner is calculated based on the coordinates for the corner and for two vertices adjacent to the corner.

10. The computer-implemented method of claim 7 wherein the different radii of curvature are implemented by varying a scale factor R that relates distance in the two-dimensional (x,y) representation with the parameter t.

11. The computer-implemented method of claim 10 wherein an edge between a first corner and a second corner having different radii of curvature implemented by scale factors $R_1$ and $R_2$, respectively, is parameterized using scale factor $R_1$ for a fraction $[R_1/(R_1+R_2)]$ of the edge adjacent to the first corner and using scale factor $R_2$ for a fraction $[R_2/(R_1+R_2)]$ of the edge adjacent to the second corner.

12. The computer-implemented method of claim 1 wherein calculating smoothed two-dimensional representations of the polygon boundaries comprises:
sampling the smoothed parametric representations $\tilde{\gamma}(t)$ at parameter values $t_1$ wherein the sampling granularity is adjustable.

13. The computer-implemented method of claim 1 wherein the smoothed two-dimensional representations of the polygon boundaries comprise:
straight edges represented by the (x,y) coordinates of vertices of the edges; and
rounded corners represented by samples of the smoothed parametric representations $\tilde{\gamma}(t)$ of the rounded corners.

14. The computer-implemented method of claim 1 further comprising:
grouping consecutive corners of polygon boundaries into corner clusters based on separation as measured by the parameter t, wherein applying the smoothing filter f(t) is applied to segments of the parametric representations γ(t) that contain all corners in the same corner cluster.

15. The computer-implemented method of claim 14 further comprising:
determining a pair of pivot points for each corner cluster, wherein the smoothing filter f(t) is applied only between the pivot points.

16. The computer-implemented method of claim 1 further comprising:
reducing line-end pullback.

17. The computer-implemented method of claim 1 wherein the smoothed two-dimensional representations are a continuous function of the design layout.

18. A system for estimating corner rounding in lithographic masks, the system comprising:
means for accessing a design layout of a lithographic mask, the design layout comprising a plurality of polygons described by two-dimensional representations in (x,y);
means for calculating parametric representations γ(t)=(x(t), y(t)) of the two-dimensional representations of the polygon boundaries, wherein the parametric representations are a function of the parameter t;
means for applying a smoothing filter f(t) to the parametric representations γ(t) to produce smoothed parametric representations $\tilde{\gamma}(t)$;
means for calculating smoothed two-dimensional representations of the polygon boundaries from the smoothed parametric representations $\tilde{\gamma}(t)$, wherein the smoothed two-dimensional representations have rounded corners on the polygon boundaries; and
means for altering the design layout of the lithographic mask based on the smoothed two-dimensional representations of the polygon boundaries with rounded corners.

19. A non-transitory computer-readable storage medium storing executable computer program instructions for estimating corner rounding in lithographic masks, the instructions executable by a processor and causing the processor to perform a method comprising:
accessing a design layout of a lithographic mask, the design layout comprising a plurality of polygons described by two-dimensional representations in (x,y) of boundaries of the polygons;
calculating parametric representations γ(t)=(x(t), y(t)) of the two-dimensional representations of the polygon boundaries, wherein the parametric representations are a function of the parameter t;
applying a smoothing filter f(t) to the parametric representations γ(t) to produce smoothed parametric representations $\tilde{\gamma}(t)$; and
calculating smoothed two-dimensional representations of the polygon boundaries from the smoothed parametric representations $\tilde{\gamma}(t)$, wherein the smoothed two-dimensional representations of the polygon boundaries have rounded corners on the polygon boundaries; and
altering the design layout of the lithographic mask based on the smoothed two-dimensional representations of the polygon boundaries with rounded corners.

* * * * *